United States Patent
Chen et al.

(10) Patent No.: US 6,761,975 B1
(45) Date of Patent: Jul. 13, 2004

(54) POLYCARBOSILANE ADHESION PROMOTERS FOR LOW DIELECTRIC CONSTANT POLYMERIC MATERIALS

(75) Inventors: Tian-An Chen, Duluth, GA (US); Anna M. George, Sunnyvale, CA (US); Kreistler S. Y. Lau, Sunnyvale, CA (US); Hui-Jung Wu, Fremont, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/471,299

(22) Filed: Dec. 23, 1999

(51) Int. Cl.[7] ............................. C08G 77/00; B32B 17/10
(52) U.S. Cl. ...................... 428/429; 428/446; 428/450; 428/447; 528/10; 528/25; 528/26; 528/31; 528/33; 528/34; 525/474
(58) Field of Search ................................ 428/209, 446, 428/447, 450, 429; 528/25, 10, 26, 31, 33, 34; 525/474, 475

(56) References Cited

U.S. PATENT DOCUMENTS

| | | | |
|---|---|---|---|
| 4,159,259 A | * | 6/1979 | Yajima et al. ............... 528/14 |
| 4,248,814 A | * | 2/1981 | Yajima et al. ................ 264/63 |
| 4,257,932 A | | 3/1981 | Beers ........................... 260/18 |
| 4,461,876 A | | 7/1984 | Surprenant .................. 524/788 |
| 4,950,583 A | | 8/1990 | Brewer et al. .............. 430/311 |
| 5,393,815 A | | 2/1995 | Takeda et al. .............. 524/262 |
| 5,602,060 A | | 2/1997 | Kobayashi et al. ......... 437/238 |
| 5,789,325 A | | 8/1998 | Chandra et al. ............ 438/781 |
| 6,162,743 A | * | 12/2000 | Chu et al. ................... 438/781 |
| 6,225,238 B1 | * | 5/2001 | Wu ............................ 438/778 |

* cited by examiner

*Primary Examiner*—Deborah Jones
*Assistant Examiner*—Stephen Stein
(74) *Attorney, Agent, or Firm*—Rutan & Tucker, LLP; Sandra P. Thompson; Robert D. Fish

(57) ABSTRACT

The adhesion of low k poly(arylene ether) dielectric coating compositions is effectively enhanced by a polycarbosilane promoter additive or primer. A coating composition is prepared by (a) providing a poly(arylene ether) composition; and (b) adding to said composition a small effective adhesion promoting amount of certain polycarbosilanes. The adhesion enhanced coating compositions are cured by heat treatment at temperatures in excess of 50° C. to form a polycarbosilane-modified poly(arylene ether) polymer composition having a low k dielectric constant for use in semiconductor devices.

10 Claims, 1 Drawing Sheet

POLYCARBOSILANE ADHESION PROMOTERS FOR LOW DIELECTRIC CONSTANT POLYMERIC MATERIALS

BACKGROUND OF THE INVENTION a) Field of the Invention

The present invention relates to low dielectric constant (low k) polymer compositions and more particularly to the use of polycarbosilane materials to enhance the adhesion of low k polymer coatings to adjacent substrates.

b) Related Art

In the prior art fabrication of semiconductor integrated circuit devices, fine patterns of circuitry in the form of semiconductor regions, electrodes, wiring and other components are fabricated onto a semiconductor substrate by using conventional processing, such as etch and chemical vapor deposition (CVD) processes, among others. After formation of a wire pattern on the substrate layer, an interline dielectric material deposition process ensues to both fill in the spaces between the horizontally disposed wiring and overcoat the pattern. Alternatively, a damascene technique can be performed in which a dielectric layer is deposited onto a substrate, patterned, and etched back to create recessed regions in which metal is inlaid to create interconnect wiring. These deposition steps as well as other multi-layer formation processes, well-known in the art, are provided to form a multi-layered integrated semiconductor device.

As the electronics fabrication industry moves towards more compact circuitry with finer circuit or line geometry in densely-packed circuit patterns, the dielectric constant requirements of the insulating layers grows more demanding for lower values. Under these circumstances, the use of low k polymer dielectrics that minimize capacitance and reduce power consumption and cross talk, while increasing signal propagation speed, becomes a necessity. The dielectric materials must possess dielectric constants no higher than 3.0 and should have dielectric constants as low as possible toward a theoretical limit of 1.0. The practical expectation for polymer dielectrics is in the range of 2.2 to 3.0. For organic dielectrics, thermal stability is an important consideration, as semiconductor processing can involve exposure to temperatures in excess of 400° C. The organic dielectrics must have glass transition temperatures above 300° C. and as high as possible towards 450° C., as well as a decomposition temperature in excess of 450° C. Preferably, the organic polymers should be easily processed by standard spin-bake-cure processing techniques. The organic dielectrics should also be free from moisture and out-gassing problems, in addition to having expected adhesive and gap-filling qualities, and dimensional stability towards thermal cycling, etching, and chemical mechanical polishing.

Various polymers have been proposed and utilized as dielectric materials for integrated circuits, such polymers including polyimides, and arylene ether polymers. Polyimide resins generally demonstrate high moisture absorption due to their polarizing chemical structures, resulting in an increasing dielectric constant. Organosilicon polymers have also been identified as low dielectric constant materials. In particular, siloxane based resins including hydridosiloxane resins, organohydridosiloxane resins, and spin-on glass siloxanes and silsesquioxanes are used as dielectric layers. Other classes of organosilicon materials include polyperhydrido-silazanes and nanoporous dielectric silica coatings formed from liquid alkoxysilane compositions. Most of these materials exhibit difficulties in processing due to chemical or mechanical instability.

Arylene ether polymers have been found particularly useful as low k dielectric materials in IC applications. Arylene ether polymers have been identified as organic dielectric materials and include poly (arylene ether) (PAE), poly (arylene ether ether ketone) (PAEEK), poly (arylene ether ether acetylene) (PAEEA), poly (arylene ether ether acetylene ether ether ketone) (PAEEAEEK), poly (arylene ether ether acetylene ketone) (PAEEAK), and poly (naphthylene ether) (PNE) comprising different polymer designs that include homopolymers, block or random copolymers, polymer blends, interpenetrating polymer networks (IPNs), and semi-interpenetrating polymer networks (SIPNs). Other examples of organic dielectric materials in current use include the polymeric material obtained from the phenylethynylated aromatic monomer provided by Dow Chemical Company under the trademark SILK™ and the poly (arylene ether) provided by Schumacher under the tradename VELOX™.

In commonly assigned U.S. patent applications Ser. No. 08/665,189, filed on Jun. 14, 1996, and Ser. No. 09/197,478, filed on Dec. 12, 1997, there are disclosed certain poly (arylene ethers) which have low dielectric constants, high glass transition (Tg) temperatures, good thermal stability to and above the Tg, low moisture absorption rate, and good storage modulus retention. However, adhesion of these and the other cited organic polymer insulators to substrate surfaces have been found in need of enhancement, generally requiring addition (or primer application) of known adhesion promoters. These prior art adhesion promoters have been found generally unacceptable in combination with the dielectric poly(arylene ethers) and other organic dielectrics because: (1) their primer application generally requires a separate coating process step; and (2) their presence may generate unanticipated chemical side reactions (e.g. generation of volitiles due to materials breakdown) during IC high temperature processing.

It has presently been discovered that certain polycarbosilanes can be used as compatible a adhesion promoters for low dielectric constant polymers, particularly poly(arylene ethers), and can be used as an additive with these polymers and processed to form modified low k dielectric polymeric coating compositions with enhanced adhesive characteristics. More precisely, it has been found that the adhesion of poly(arylene ether) dielectric coating compositions is particularly enhanced by the primer application or compositional addition of an adhesion promoter material comprising at least one polycarbosilane. The instant polycarbosilane adhesion promoters can be employed as a surface deposition treatment (primer) or as an internal compositional additive to dielectric polymer compositions. These polycarbosilane promoters can be prepared, provided or used at reasonable cost; and provide enduring adhesion to a variety of surfaces.

SUMMARY OF THE INVENTION

The present invention provides new and improved adhesion promoting materials effective in enhancing the adhesion of low dielectric constant polymer compositions to various substrates. The new and improved adhesion promoter composition comprises a polycarbosilane of the formula:

FORMULA (I)

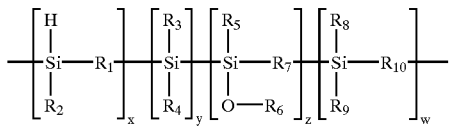

in which:
R$_1$, R$_7$, and R$_{10}$ each independently represents a substituted or unsubstituted alkylene, cycloalkylene, or arylene group;

R$_2$, R$_3$, R$_4$, R$_5$, R$_8$ and R$_9$ each independently represents a hydrogen atom or organic group.

R$_6$ represents an organosilicon, a silanyl, a siloxyl, or an organo group; and x, y, z and w satisfying the conditions of [4≦x+y+z+w≦100,000], and y and z and w can collectively or independently be zero.

In order to improve the adhesion of low dielectric constant polymer coatings to electronic surfaces, substrates such as silicon, silicon dioxide, silicon nitride and aluminum are treated with the instant polycarbosilanes as adhesion promoters in two different forms. The polycarbosilane materials can be added to surfaces as primer coatings from a solution containing typically from about 0.05 to 20% by weight of the polycarbosilane promoter. Alternatively and preferably, the polycarbosilane adhesion promoters can be compositionally added to a low k dielectric polymer in certain concentrations and effect in-situ adhesion capability in the cured or dried polymer coating composition. When used as surface primers, the present polycarbosilane adhesion promoter compounds engender superior bonding capacity to substrate surfaces to which low k polymer coatings are subsequently applied. In more preferred embodiments, the polycarbosilane adhesion promoter compounds are added to dielectric polymer compositions and subjected to a thermal or high energy-source to generate coatings having superior adhesion characteristics throughout the entire polymer composition so as to ensure affinity to any contacted surface of the polymer coating. The instant polycarbosilane additives are compatible with low k dielectric polymers thereby enabling formation of polycarbosilane-modified low k dielectric polymers which possess enhanced adhesive characteristics compared with the base polymer, while maintaining the other beneficial physical and electrical properties.

While poly(arylene ether) and the other dielectric organic coating materials have suitable low k dielectric constants and the thermal stability and high mechanical strength characteristics needed for coating presently miniaturized patterned wiring of semiconductor wafers, these prior art materials have less resistance to delamination than is desirable. It has been found that combining poly(arylene ethers) with small, effective amounts of the present polycarbosilane adhesion promoters, spin coating a surface with same, and subjecting the resulting film to a thermal or high energy curing process results in a polycarbosilane-modified poly (arylene ether) polymer film composition having improved adhesion characteristics over those exhibited by the base poly(arylene ether) base polymer. These films possess a low dielectric constant, high thermal stability, high mechanical strength, and excellent adhesion to electronic substrate surfaces including silicon, silicon nitride, titanium nitride, silicon dioxide, aluminum and tantalum. Because the polycarbosilane is molecularly dispersed, these films demonstrate excellent adhesion to all affixed surfaces including underlying substrates and overlayed capping or masking layers, such as SiO$_2$ and Si$_3$N$_4$ capping layers. The use of these polycarbosilane-modified polymer films eliminates the need for an additional process step in the form of at least one primer coating application to achieve adhesion of the film to a substrate and/or overlaid surface.

In accordance with the invention, new and improved poly(arylene ether) coating compositions exhibiting superior adhesion to electronic substrate surfaces are provided, said poly (arylene ether) compositions comprising:

(a) a poly(arylene ether) having the repeating units of the formula:

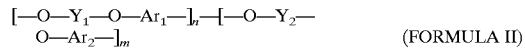 (FORMULA II)

wherein n=0 to 1; and m=1−n; and wherein Y$_1$, Y$_2$, Ar$_1$ and Ar$_2$ are each a divalent arylene radical, Y$_1$ and Y$_2$ being selected from a second group of divalent arylene radicals; and (b) a small, effective amount of an adhesion promoter comprised of at least one polycarbosilane of Formula (I):

In another aspect of the invention there is provided a method for forming electrically insulating films of the instant polycarbosilane/poly(arylene ether) compositions. This process includes applying a coating of the instant polycarbosilane/poly(arylene ether) adhesion promoting compositions to an electronic substrate surface and subjecting the coating to heat or other high energy to cure the coating thereby forming a thermally stable, adhesive, low dielectric constant (k less than 3.0) polycarbosilane-modified poly(arylene ether) film. This film generating process can employ any form of energy such as thermal (heat) or other high energy such as electron beam (e-beam), U.V. light, and any other functional forms of high energy. These energy sources are applied to the instant polycarbosilane/poly(arylene ether) composition to convert the mixture to low k polycarbosilane-modified poly(arylene ether) film compositions of the present invention. The most expeditious process is the application of thermal energy (heat) to the instant compositions in increasing temperature thermal plateaus of from about 50° C. to about 450° C. The nature of the subject polycarbosilane/poly(arylene ether) compositions enables use of general wet coating and heating processes in the formation of a very low dielectric constant insulation structures without employing exotic production techniques.

The present invention is also directed to a multilayer electronic circuit article comprising: (i) a silicon, glass or ceramic substrate, (ii) a plurality of layers or regions of an insulating material on a surface of the substrate, and (iii) at least one layer or region of a conductive material selected from the group consisting of metals and semiconductor materials, interposed between adjacent layers of the insulating material or within a layer of the insulating material, the insulating material comprising the low k dielectric polycarbosilane-modified/poly (arylene ether) coatings of the present invention.

When the polycarbosilane/poly(arylene ether) compositions of the instant invention are subjected to an energizing source such as thermal energy, a polycarbosilane-modified poly(arylene ether) low k dielectric film composition is formed. These low k dielectric composition film coatings have the unique feature of good adhesion to a variety of common semiconductor surfaces without the need for any other prior art adhesion enhancing materials, the addition of which would require undesirable additional process steps and carry the risk of decomposition resulting in outgassing of these materials in hostile semiconductor processing environments. The present polycarbosilane-modified poly (arylene ether) coatings have sufficient glass transition temperature values (Tg) above 350° C. so as to form heat resistant, low dielectric constant (low k) semiconductor films which withstand harsh high temperature environments in current processing methodology of semiconductor devices.

In addition, the instant dielectric coatings possess good gap filling qualities for integrated circuits in semiconductor articles and therefore completely fill spaces between conductive lines of 0.25 microns (μm) or less. The low k polycarbosilane-modified poly(arylene ether) coatings of the present invention also possess sufficient thermal stability so as not to evidence any out-gassing during ongoing semiconductor processing, low moisture absorption to retain film resistivity, and stability to a variety of common etching and other semiconductor fabrication processes. As in the case of ordinary organic dielectric materials, the present low k polycarbosilane-modified poly(arylene ether) compositions dielectric coatings can be easily applied in high yield to substrates using standard spin-bake-cure processing techniques, thus insuring their cost effectiveness. Finally, the polycarbosilane-modified poly(arylene ether) dielectric coatings developed and disclosed herein are applicable for use in other micro electronic devices in addition to ICs, for example, printed circuit boards (PCBs), multi-chip modules (MCMs) and the like.

The subject invention is based on the finding that certain polycarbosilanes are excellent adhesion promoters and are compatible with poly(arylene ether) compositions. These polycarbosilanes can be compositionally added to the poly (arylene ethers) in small and yet effective amounts to form the adhesive polycarbosilane-modified poly (arylene ether) semiconductor film coatings of the present invention. The polycarbosilane adhesion promoting compounds are added in small, effective amounts of up to 20% based on the weight of the poly(arylene ether) base polymer composition, and amounts up to about 5.0% by weight of the a base polymer are generally preferred. Operable ranges of polycarbosilane are from about 0.5 to 20% while preferred ranges are from about 0.5 to 5% based on the weight of the poly(arylene ether) base polymer.

Preferred adhesion promoting polycarbosilane compounds of the invention are polycarbosilanes in which the $R_2$ group of Formula I is a hydrogen atom or an and $R_1$ is methylene and the appendent radicals w, y, and z are zero. Other preferred adhesion promoting polycarbosilane compounds of the invention are polycarbosilanes of Formula I in which $R_2$ and $R_8$ are hydrogen, $R_1$ and $R_{10}$ are methylene, and $R_9$ is an alkenyl, and appendent radicals y and z are zero. Examples of preferred polycarbosilane compounds include poly-dihydridocarbosilane, polyallylhydridocarbosilane, and random copolymers of polydihydridocarbosilane and polyallylhydridocarbosilane. The instant polycarbosilane adhesion promotor compounds can be prepared from well known prior art processes or provided by manufacturers of polycarbosilane compositions.

Specific embodiments of the new and improved polycarbosilane/poly(arylene ether) coating compositions exhibiting superior adhesion to electronic surfaces within the scope of the present invention are provided by those compositions comprising:

a) 100 parts by weight of a polymer compositition selected from the group of poly(arylene ether) homopolymers, block or random copolymers, and polymer blends consisting essentially of: (i) a copolymer of (a) fluorene bisphenol, (b) bis (4-fluorophenyl) ethyne and (c) 4,4'-difluorobenzophenone in a 2:1:1 monomer ratio; (ii) a homopolymer of (a) fluorene bisphenol, and (b) 4-fluoro-3'-(fluorobenzoyl) tolane in a 1:1 monomer ratio; (iii) a homopolymer of (a) fluorene bisphenol, and (b) bis (4-fluorophenyl)ethyne in a 1:1 monomer ratio: and (iv) a homopolymer of (a) fluorene bisphenol and (b) 4,4'-difluorobenzophenone in a 1:1 monomer ratio; and b) from about 0.5 to 20 parts by weight of an adhesion promoter composition comprising at least one polycarbosilane of the formula:

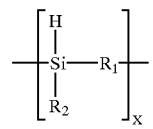

in which:

$R_1$ independently represents a substituted or unsubstituted alkylene, cycloalkylene, or arylene group;

$R_2$ is a hydrogen atom or an organic group; and x is an average number from about 10 to 15,000.

The new and improved polycarbosilane adhesion promoters and the adhesion enhanced polycarbosilane/poly(arylene ether) coating compositions are efficient and inexpensive to produce and use than prior art materials and exhibit very satisfactory adhesion to the surfaces of electronic devices.

BRIEF DESCRIPTION OF THE DRAWINGS

The present invention will be more clearly understood from the description as set forth below with reference to the accompanying drawings wherein.

DETAILED DESCRIPTION OF THE INVENTION

Figure 1:
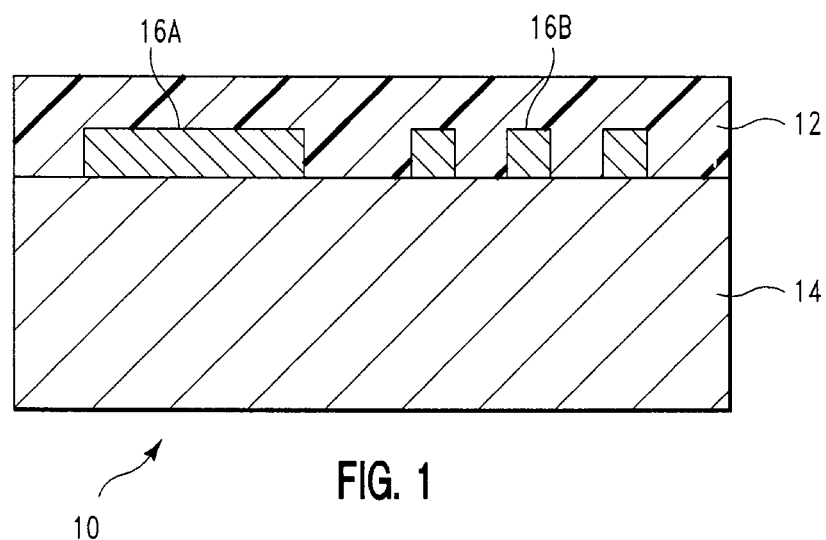
FIG. 1 is a cross-sectional view of one semiconductor device according to the present invention having a planarized dielectric film layer coating for a metallized interconnect structure.

The present invention is directed to the polycarbosilane adhesion promoter compositions of Formula I. In another embodiment of the invention, there is provided a composition comprising:

(a) a poly(arylene ether); and (b) small, effective amounts by weight of an adhesion promoter comprised of at least one polycarbosilane of the general formula:

FORMULA (I)

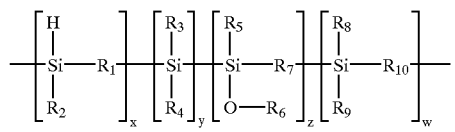

in which:

$R_1$, $R_7$, and $R_{10}$ each independently represents a substituted or unsubstituted alkylene, cycloalkylene, or arylene group;

$R_2$, $R_3$, $R_4$, $R_5$, $R_8$ and $R_9$ each independently represents a hydrogen atom or organic group.

$R_6$ represents an organosilicon, a silanyl, a siloxyl, or an organo group; and x, y, z and w satisfying the conditions of [$4 \leq x+y+z+w \leq 100,000$], and y and z and w can collectively or independently be zero.

The poly(arylene ethers) of the subject invention have the repeating units of the formula:

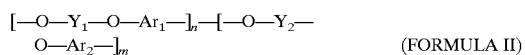

(FORMULA II)

wherein n=0 to 1; and m=1−n; and wherein $Y_1$, $Y_2$, $Ar_1$ and $Ar_2$ are each a divalent arylene radical; $Y_1$ and $Y_2$ are each selected from a first group of divalent arylene radicals; $Ar_1$ is selected from a second group of divalent radicals and $Ar_2$ is selected from a third group of divalent radicals; the first group of divalent arylene radicals consisting of:

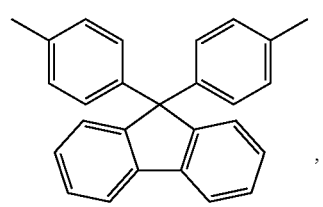

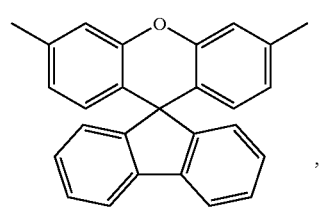

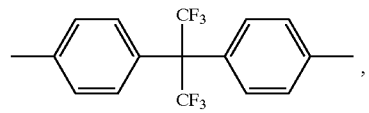

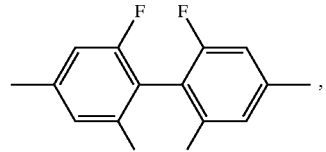

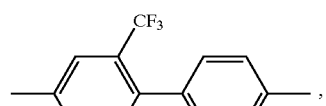

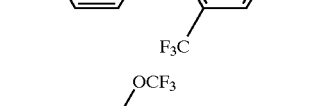

-continued

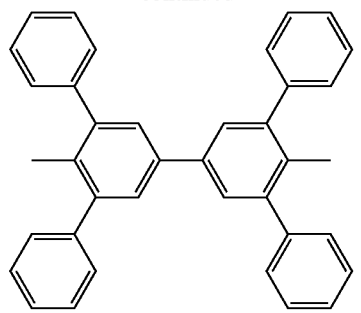

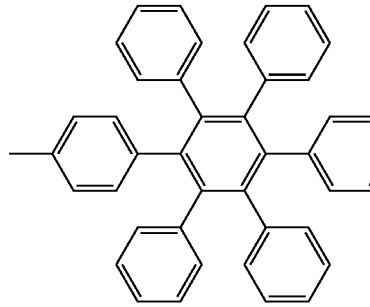

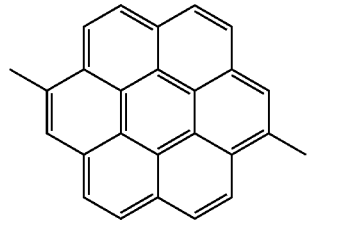

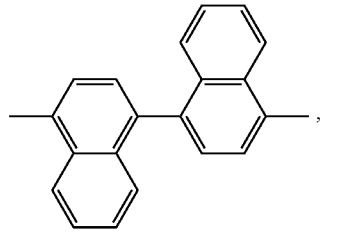

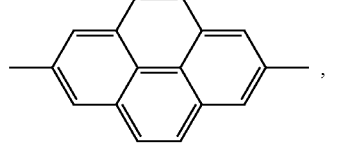

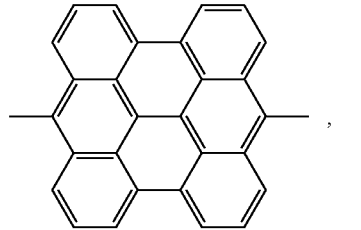

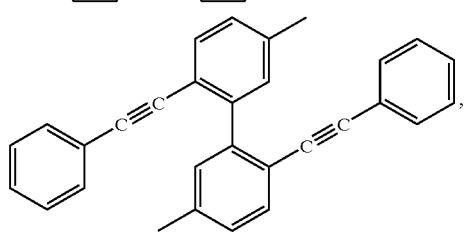

and mixtures thereof; the second group of divalent arylene radicals consisting of:

and mixtures thereof; the third group of divalent arylene radicals consisting of:

-continued

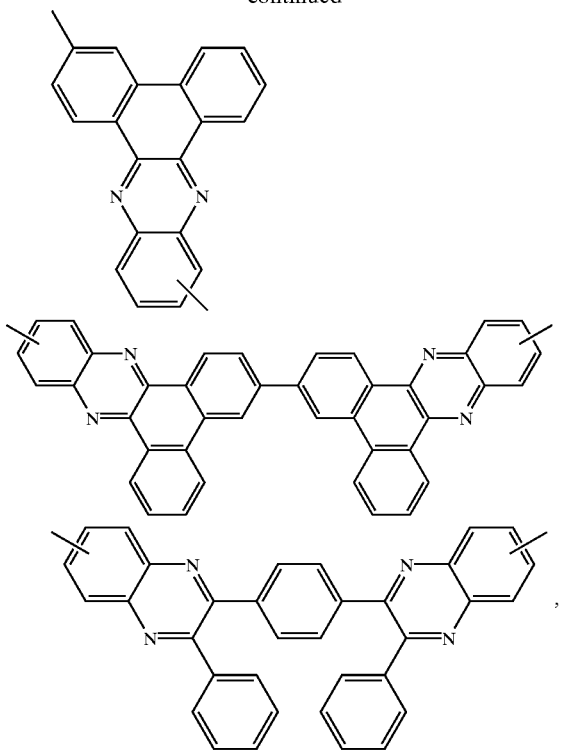

and mixtures thereof. In some embodiments of the present invention $Y_1$ and $Y_2$ can both be derived from fluorene bisphenol, and n=0.1 to 1. The preparation of these poly (arylene ethers) is outlined in the commonly assigned patent applications cited above, each incorporated herein by reference. These compositions are commercially manufactured and distributed as FLARE™ poly (arylene ethers) by the instant assignee, AlliedSignal, Inc.

The subject polycarbosilane/adhesion promoting poly (arylene ether) coating compositions are applied to electronic surface substrates. The coated substrate is then heat treated and cured at temperatures of from 50° C. to about 450° C. to convert the poly(arylene ether)/polycarbosilane mixture to a polycarbosilane-modified poly (arylene ether) polymer composition coating having a low dielectric constant.

In addition to finding application with the poly (arylene ether) polymers of Formula II above, the polycarbosilane compositions disclosed herein are appropriately used as promoters with many other organic dielectric polymers including poly (arylene ether) (PAE), poly (arylene ether ether ketone) (PAEEK), poly (arylene ether ether acetylene) (PAEEA), poly (arylene ether ether acetylene ether ether ketone) (PAEEAEEK), poly (arylene ether ether acetylene ketone) (PAEEAK) and their block or random copolymers and blends. Mixtures of one or more of the polycarbosilanes of Formula I may be employed in this invention. Alternatively, a promoter mixture including one or more of the instant polycarbosilanes and another known promoter compound or composition may be used.

The present invention is a simple, practical and versatile approach to improve interfacial adhesion between high glass transition temperature (Tg) fluorinated and nonfluorinated poly (arylene ethers) and electronic surfaces. The invention focuses on the use of a versatile polycarbosilane polymer adhesion promoter compounds or compositions to address the requirement that organic thin films possess high adhesive strengths to different substrates, in particular silicate and silicon nitride surfaces while at the same time maintaining the high temperature stability, high mechanical strength and high Tg of the organic polymer film.

The invention is further directed to adding certain amounts of adhesion promoting polycarbosilanes represented by Formula (I) to poly (arylene ethers) represented by Formula (II), coating the mixture onto an electronic substrate, and heating the coated substrate from about 50° C. to elevated temperatures up to 450° C. under atmospheric or inert blanket environments to convert the polymer mixture to a polycarbosilane-modified poly (arylene ether) polymer film having a low dielectric constant equal to or less than 3.

It is to be again appreciated that the improved adhesion characteristics achieved molecularly by the instant polycarbosilane modified poly(arylene ether) compositions renders the adhesion enhanced films adherent to any contact ed surface. Accordingly, the instant low k polycarbosilane modified films can be adherent interlayers, effectively affixing to a substrate and an overlayer, as demonstrated in FIG. 2 where the polycarbosilane modified poly(arylene ether) sandwich layer is affixed to both the silicon substrate 32 and the illustrated silicon dioxide hardmask overlaid layer 36. This is to be contrasted with conventional primer promoter compositions which additionally require separate coating application steps to any surface requiring adhesion enhancement.

The small, effective amounts of polycarbosilane adhesion promoter added to the base poly(arylene ether) are important to the charateristics of the instant polycarbosilane-modified poly(arylene ether) polymer composition of the instant invention. The quantity of polycarbosilane range from about 0.5 to 20% by weight of the poly(arylene ether) base composition with preferred amounts of polycarbosilane adhesion promote r ranging from about 0.5 wt % to about 5 wt. % measured by the weight of the poly(arylene ether) base polymer.

In yet another specific embodiment there is provided a process for the preparation of a organosilicon-modified poly(arylene ether) film coated electronic substrate comprising the steps of: (a) providing a solvent solution of a poly (arylene ether) of Formula (II) and an adhesion promoting polycarbosilane of the above mentioned general formula (I) in an amount of from 0.7 to 5% based on the poly(arylene ether) base polymer composition; (b) spin coating the poly (arylene ether)/polycarbosilane solution onto an electronic substrate; and (c) heating the coated substrate at gradually increasing temperatures of from 50° C. to about 450° C., thereby converting the coating to a polycarbosilane-modified poly(arylene ether) polymer low k dielectric film composition.

The present invention is particularly advantageously suited for the poly(arylene ethers) of Formula (II). These and other poly (arylene ethers) disclosed in U.S. patent applications Ser. No. 08/665,189, filed on Jun. 14, 1996, and Ser. No. 08/990,157, filed on Dec. 12, 1997 (commonly assigned to AlliedSignal, Inc.) are especially useful within the purview of the present invention. And as already indicated, the polycarbosilane compositions herein presented are useful with a variety of other organic polymer dielectric materials. These include organic dielectric polymers, such as the nonfluorinated polymeric material obtained from the phenylethynylated-aromatic monomers and oligomers provided by the Dow Chemical Company under the trademark SILK™ and the poly(arylene ether) polymers provided by Schumacher under the trademark VELOX™, and the fluorinated polymeric materials, such as fluorinated polyimides (DuPont Chemical Co.) and Speed Film™, a fluorinated polymer sold by W. L. Gore Company.

In the subject adhesion promoting polycarbosilanes of Formula (I), $R_1$, $R_7$, and $R_{10}$ represent substituted or unsubstituted alkylene, cycloalkylene or arylene groups. The $R_2$, $R_3$, $R_4$, $R_5$, $R_8$, and $R_9$ of Formula (I) each independently represents a hydrogen atom or an organo group in the form of a substituted or unsubstituted alkyl, alkenyl, alkynyl, or aryl group. The alkyl, alkenyl, and alkynyl groups generally can contain up to 18 carbon atoms but generally contain from about 1 to 10 carbon atoms. Preferred polycarbosilanes of the present invention include dihydrido polycarbosilanes in which the $R_2$ group is a hydrogen atom and there are no appendent radicals in the polycarbosilane chain; that is, y, z and w are all zero. Another preferred group of polycarbosilanes are those in which the $R_2$, $R_3$, $R_4$, $R_5$, $R_8$, and $R_9$ groups of Formula (I) are substituted or unsubstituted alkenyl groups having from 2 to 10 carbon atoms. The alkenyl group may be ethenyl, propenyl, allyl, butenyl or any other unsaturated organic backbone radical having up to 10 carbon atoms. The alkenyl group may be dienyl in nature and includes unsaturated alkenyl radicals appended or substituted on an otherwise alkyl or unsaturated organic polymer backbone. Examples of these preferred polycarbosilanes include dihydrido or alkenyl substituted polycarbosilanes such as polydihydridocarbosilane, polyallylhydrididocarbosilane and random copolymers of polydihydridocarbosilane and polyallylhydridocarbosilane.

As can be observed in Formula (I), the adhesion promoting polycarbosilanes utilized in the subject invention may contain oxidized radicals in the form of siloxyl groups when $z>0$. Accordingly, $R_6$ represents an organosilicon, a silanyl, a siloxyl, or an organo group when $z>0$. It is to be appreciated that the the oxidized versions of the polycarbosilanes of Formula (II) ($z>0$) operate very effectively in, and are well within the purview of the present invention. As is equally apparent, z can be zero independently of x, y, and w the only conditions being that the radicals x, y, z and w of the Formula I polycarbosilanes must satisfy the conditions of $[4<x+y+z+w<100,000]$, and y and z can collectively or independently be zero.

The polycarbosilane adhesion promoters or poly (arylene ether) materials used herein can be produced from starting materials which are presently commercially available from many manufacturers. They may be produced by using conventional polymerizable processes or the proprietary preparations cited above with respect to the poly (arylene ethers). As an example of synthesis of the polycarbosilanes, the starting materials can be produced from common organo silane compounds or from polysilane as a starting material by heating an admixture of polysilane with polyborosiloxane in an inert atmosphere to thereby produce the corresponding polymer or by heating an admixture of polysilane with a low molecular weight carbosilane in an inert atmosphere to thereby produce the corresponding polymer or by heating an admixture of polysilane with a low molecular carbosilane in an inert atmosphere and in the presence of a catalyst such as polyborodiphenylsiloxane to thereby produce the corresponding polymer. Polycarbosilanes can also be synthesized by Grignard Reaction reported in U.S. Pat. No. 5,153,295 hereby incorporated by reference. The poly (arylene ether) polymeric materials can be prepared in accordance with processes outlined and/or disclosed in the patent applications cited above and hereby incorporated by reference.

Additives can be used to enhance or impart particular target properties to the instant poly (arylene ether)/polycarbosilane adhesion promoter compositions, as is conventionally known in the polymer art, including additional adhesion promoters, stabilizers, flame retardants, pigments, plasticizers, surfactants, and the like. Compatible or non-compatible polymers can be blended in to engender a desired property in addition to the adhesion enhancement provided by the present polycarbosilane adhesion promoters.

Film or coatings of the instant poly(arylene ether)/polycarbosilane polymer mixture of Formulas I and II can be formed by solution techniques such as spraying, spin coating, or casting, with spin coating being preferred. Suitable solvents for use in such solutions of the adhesion promoted poly (arylene ether) compositions of the present invention include aprotic solvents, for example, cyclic ketones such as cyclopentanone, cyclohexanone, cycloheptanone, and cyclooctanone (as practical examples); cyclic amides such as N-alkylpyrrolidinone wherein the alkyl has from about 1 to 4 carbon atoms (as practical examples) and N-cyclohexylpyrrolidinone and mixtures thereof. A wide variety of other organic solvents can be used herein insofar as they are able to aid dissolution of the polycarbosilane and at the same time effectively control the viscosity of the resulting polymeric solution as a coating solution. Various facilitating measures such as stirring and/or heating may be used to aid in the dissolution. Suitable solvents include hydrocarbon solvents such as methylisobutylketone (MIBK), dibutyl ether, xylene, benzene, toluene, n-heptane, hexane, cyclohexane, octane, decane, or cyclic dimethylpolysiloxanes and the like. Typically, coating thicknesses are between 0.1 to about 15 microns. As a dielectric interlayer, the film thickness is generally less than 2 microns.

The polycarbosilane-modified poly(arylene ethers) of the present invention can also be used as interlayer dielectrics in an interconnect associated with a single integrated circuit ("IC") chip. An integrated circuit chip would typically have on its surface plural layers of the instant polycarbosilane-modified poly(arylene ether) dielectric and multiple layers of metal conductors. It can also include regions of the polycarbosilane-modified poly(arylene ether) dielectric between discrete metal conductors or regions of conductor in the same layer or level of an integrated circuit.

In application of the instant polymers to ICs, a solution of one or more of the poly (arylene ether)/polycarbosilane adhesion promoter compositions of the present invention is applied to a semiconductor wafer using conventional wet coating processes as, for example, spin coating (other well known coating techniques such as spraying can be employed in specific cases). As an illustration, a cyclohexanone solution of a polymer composition comprised of the compounds of formula II and a small percentage of another polymer comprised of Formula I is spin-coated onto a substrate having electrically conductive components fabricated therein and the coated substrate is then subjected to the thermal film forming process of the instant invention. An exemplary formulation of the instant composition is prepared by disolving the poly(arylene ether)/polycarbosilane adhesive promoting composition in cyclohexanone solvent under ambient conditions with strict adherence to a clean-handling protocol to prevent trace metal contamination in any conventional apparatus having a non-metallic lining. The resulting solution is comprised of from 1 to about 50 wt %, based on the total weight of the solution of the poly (arylene ether)/polycarbosilane composition, and preferably from about 3 to 20 wt %, the remainder being solvent.

Application of the instant adhesion promoted poly (arylene ether) polymer compositions onto planar or topographical surfaces or substrates can be carried out by using any conventional apparatus, preferably a spin coater, because the poly (arylene ether)/polycarbosilane compositions used herein have a controlled viscosity suitable for such a coater. Evaporation of the solvent by any suitable means, such as simple air drying by exposure to an ambient environment or by heating on a hot plate to 250° C., can be employed in the coating application of the present low k dielectric polymer/polycarbosilane composition.

The instant poly (arylene ether)/polycarbosilane compositions can also be used as a dielectric substrate material in circuit boards or printed wiring boards. The circuit board made up of the subject poly (arylene ether)/polycarbosilane adhesion promoter compositions will have mounted on its surface pattens for various electrical conductor circuits. The circuit board may include, in addition to the instant poly (arylene ether)/polycarbosilane substate, various reinforcements, such as woven non-conducting fibers or glass cloth. Such circuit boards may be single sided, as well as double sided.

After application of the poly (arylene ether)/polycarbosilane adhesion promoter compositional coating to an electronic topographical substrate, the coated structure is subjected to the process of the present invention wherein the coating is subjected to a bake and cure thermal process at increasing temperatures ranging from 50° C. up to 450° C. to polymerize the coating to its organosilicon-modified poly(arylene ether) form. The resulting dielectric layer has a low dielectric constant k defined herein as being 3 or less. These organosilicon-modified poly(arylene ether)polymer compositions physically demonstrate good adhesion to flat or topographical semiconductor surfaces or substrates.

While not to be construed as limiting it is speculated that the thermal processing of the present poly (arylene ether)/polycarbosilane composition results in a crosslinked network of the poly(arylene ether) and adhesion promoting polycarbosilane portions of the original composition. In essence, the instant thermal processing of the poly (arylene ether)/polycarbosilane composition causes the silane portions of the polycarbosilane to convert to silylene/silyl radicals which then react with both the unsaturated structures of the poly(arylene ethers) and the substrate surfaces, thereby creating a chemically bonded adherent interface for the dominant poly(arylene ether) precursor, these silylene/silyl radicals being available throughout the composition to act as attachment sources to fasten and secure any interface surface of contact by chemical bonding therewith. As already indicated, this dispersion of radicals throughout the composition accounts for the superb adhesion of the instant films to both underlying substrate surfaces as well as overlayered surface structures such as cap or masking layers illustrated in FIG. 2.

Crucial to the materials discovered herein are the findings that the polycarbosilanes of Formula I have a reactive hydrido substituted silicon in the backbone structure of the polycarbosilane. This feature of the polycarbosilane enables it to: (1) be reactive with the poly (arylene ether) portion of the coating composition and; (2) generate a polycarbosilane-modified poly (arylene ether) polymer which is durable under hostile semiconductor processing steps.

Heat curing can be carried out at any temperature and time suitable for completion of the conversion of the poly(arylene ether)/polycarbosilane promoter composition to an polyorganosilane-modified poly(arylene ether) polymer composition to generate a dielectric layer. However the curing temperature should not be below 400° C. because a lower temperature is insufficient to complete the completion of the reaction herein. Generally, it is preferred that curing is carried out at temperatures of from 400° C. to about 450° C. Curing can be carried out in a conventional curing chamber such as an electric oven, hot plate, and the like and is generally performed in an inert (non-oxidizing) atmosphere (nitrogen) in the curing chamber. Any non oxidizing or reducing atmospheres (eg. Argon, Hydrogen and Nitrogen processing gases) may be used in the practice of the present invention, if they are effective to conduct curing of the organosilicon-modified poly(arylene ether) composition to achieve the low k dielectric film herein.

In illustrative FIG. 1, a semiconductor structure 10 comprised of a polycarbosilane-modified poly(arylene ether) dielectric interlayer 12 is shown coated on semiconductor substrate 14. Note that the instant dielectric layer 12 has a flat planarized surface which masks the stepped profile of the patterned metal layer which has two types of patterned steps, i.e., a relatively wide step region 16A, such as an electrode, and a relatively narrow step region 16B such as conductive wiring. After formation and patterning of a metal layer to achieve the metal pattern shown, the instant poly (arylene ether)/polycarbosilane adhesion promoter composition layer is spin coated over the metal lines 16A and 16B using the composition of respective formulas (II) and (I) above. Thereafter this film coating is then subjected to the thermal process described herein resulting in the flat dielectric interlayer 12 surface demonstrating the planarization character of the instant low k dielectric polycarbosilane-modified poly(arylene ether) polymer composition. Accordingly, the instant polycarbosialne-modified poly (arylene ether) polymer composition and preparation thereof can be employed to sequentially coat multiple patterned metal layers.

Figure 2:
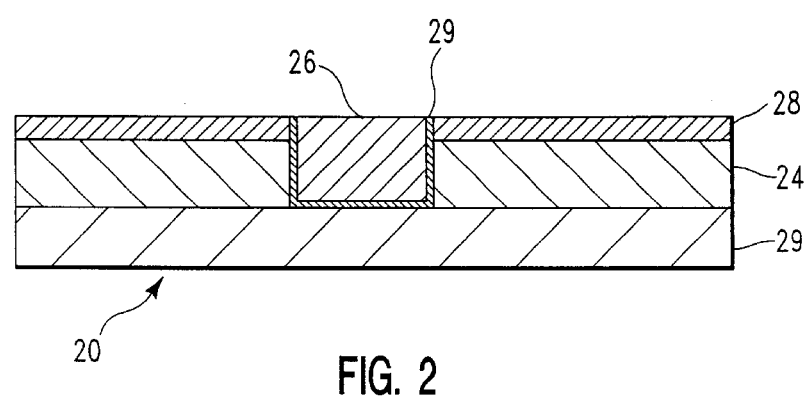
FIG. 2 depicts a damascene structure in the form of a cross section of the instant low k dielectric film insulating layer having a recessed region overlaid with a barrier layer and filled with a metal such as copper.

FIG. 2 illustrates one embodiment of a semiconductor wafer structure employing the adhesion enhanced compositions of this invention. The wafer 20 as shown includes a conductive substrate layer 22 which is covered with an insulating layer 24 comprised of a low k dielectric polycarbosilane modified poly (arylene ether) composition of the present invention. The low k dielectric layer 34 is covered or overlayed with a silicon dioxide mask or cap layer 28. As depicted, the structure features a fully metallized via or trench comprised of copper (or copper alloy) 26 over a thin Ta or TaN barrier layer 29. This semiconductor structure is obtained by spin, baking and curing a polycarbosilane/polyarylene ether composition onto the substrate 22 in the manner outlined herein to form low k dielectric layer 24. The dielectric coated substrate is then subjected to a chemical vapor deposition of silicon dioxide mask or cap layer onto the dielectric layer. The resulting layered substrate is then subjected to a patterning process by deposition of photoresist, imaging, and washing by conventional lithographic means. The resulting pattern on the device is etched through the $SiO_2$ mask and organic dielectric layers, providing a contact hole or line for metallization. A thin Ta or TaN barrier layer 29 is deposited in the contact hole or line and a layer of copper (or copper alloy) is deposited on the barrier layer to form metallized plug or line 26. The resulting semiconductor device configuration is planarized by chemical mechanical polishing techniques known in the art to form the structure of FIG. 2.

As indicated earlier, the subject polycarbosilane-modified poly(arylene ether) polymer composition coating may act as an interlayer and be covered by other coatings, such as other dielectric ($SiO_2$) coatings, $SiO_2$/modifying ceramic oxide layers, silicon containing coatings, silicon carbon containing coatings, silicon nitrogen containing coatings, silicon nitrogen carbon containing coatings and/or diamond like carbon coatings. Such multilayer coatings are taught in U.S. Pat. No. 4,973,526, which is incorporated herein by reference. And, as amply demonstrated the polycarbosilane-modified poly(arylene ether) compositions prepared in the instant process can be readily formed as interlined dielectric coatings or films between adjacent conductor paths on fabricated electronic or semiconductor substrates.

The following non-limiting Examples are provided so that one skilled in the art may more readily understand the invention.

EXAMPLE 1

A 15% solution of a poly(arylene ether) comprised of a homopolymer of (a) fluorene bisphenol and (b) 4-fluoro-3'-(fluorobenzoyl)tolane in a 1:1 monomer ratio, synthesized in earlier cited copending patent application Ser. No. 09/197,478, is prepared by dissolving 100 grams of the solid homopolymer in cyclohexanone under ambient conditions in a glasslined reactor. 10 grams of Polyallylhydridocarbosilane, $[[Si(CH_2CHCH)HCH_2]_{0.1} [SiH_2CH_2]_{0.9}]_n$ (AHPCS) purchased from Starfire Systems, Inc. was dissolved in 200 milliliters of cyclohexanone. The solution is then added to the base homopolymeric poly (arylene ether)/solvent solution with stirring to effect complete solution of the poly(arylene ether)/polycarbosilane mixture. The resulting solution is then filtered through a series of four Teflon® filtration cartridges and the polycarbosilane/poly(arylene ether) homopolymer solution is recovered. The filtration cartridges have decreasing nominal pore sizes of 1.0, 0.5. 0.2, and 0.1 $\mu$m.

EXAMPLE 2

A 13% solution of a poly(arylene ether) comprised of a copolymer of: (a) fluorene bisphenol, (b) a bis(4-fluorophenyl)ethyne, and (c) 4,4' difluorobenzophenone in a 2:1:1 monomer ratio synthesized in copending patent application Ser. No. 09/197,478, is prepared by dissolving 80 grams of the solid copolymer in cyclohexanone under ambient conditions in a glasslined reactor. Eight (8) grams of allylhydridopolycarbosilane, $[[Si(CH_2CHCH)HCH_2]_{0.1} [SiH_2CH_2]_{0.9}]_n$, (AHPCS) purchased from Starfire Systems, Inc. was dissolved in 100 milliliters of cyclohexanone. This polycarbosilane solution is then added to the base copolymeric poly (arylene ether)/solvent solution with stirring to effect complete solution of the poly (arylene ether)/polycarbosilane mixture. The resulting solution is then filtered through a series of the same sized four Teflon® filtration cartridges of Example 1 and the polycarbosilane/copolymeric poly (arylene ether) solution recovered.

EXAMPLE 3

A 15% solution of a poly(arylene ether) comprised of a homopolymer of (a) fluorene bisphenol and (b) bis(4-fluorophenyl) ethyne, synthesized in copending patent application Ser. No. 09/197,478, is prepared by dissolving 100 grams of the solid copolymer in cyclohexanone under ambient conditions in a glasslined reactor. Ten (10) grams of Polyallylhydridocarbosilane, $[[Si(CH_2CHCH)HCH_2]_{0.1} [SiH_2CH_2]_{0.9}]_n$ (AHPCS) purchased from Starfire Systems, Inc. was dissolved in 200 milliliters of cyclohexanone. The solution is then added to the base poly(arylene ether)/solvent solution with stirring to effect complete solution of the poly(arylene ether)/polycarbosilane mixture. The resulting solution is then filtered through a series of the same sized four Teflon® filtration cartridges of Example 1 and the polycarbosilane/homopolymeric poly (arylene ether) solution recovered.

EXAMPLE 4

A 20% solution of a poly(arylene ether) comprised of a homopolymer of (a) fluorene bisphenol and (b) 4,4' difluorobenzophenone copolymer, synthesized in copending patent application Ser. No. 09/197,478, is prepared by dissolving 110 grams of the solid copolymer in cyclohexanone under ambient conditions in a glasslined reactor. 8 grams of Poludihydridocarbosilane (HPCS), $[SiH_2CH_2]_n$, purchased from Starfire Systems, Inc. was dissolved in 80 mls. of cyclohexanone. This polycarbosilane solution is then added to the dominant poly (arylene ether)/cyclohexanone solution with stirring to effect complete solution of the poly(arylene ether)/polycarbosilane mixture. The resulting solution is then filtered through a series of the same sized four Teflon® filtration cartridges of Example 1 and the polycarbosilane/poly(arylene ether) solution recovered.

EXAMPLE 5

This example demonstrates a process for the application of the instant adhesion promoter enhanced poly(arylene ethers) to silicon semiconductor wafers.

Approximately 3 mls. of the respective filtered solutions of Examples 1–4 were separately processed onto the surfaces of four inch silicon wafers using a spin coater and hot plate oven track, for example a Silicon Valley Group, Inc. (SVG) Model No. 8828 coater and SVG Model No. 8840 oven track. After the solution was dispensed, each wafer was spun at 500 rpm for 5 seconds, followed by a 5 second rest and a sixty second spin at various speeds between 1000 and 5000 rpm. Each of the coated wafers were baked at thermal plateaus of 150° C., 200° C., and 250° C. for about one minute at each temperature. Each wafer was then cured in a nitrogen atmosphere in a furnace set initially at 400° C. for one hour, followed by a cool down to 100° C. The process generated a polycarbosilane modified poly (arylene ether) film coated wafer employing the organic coating materials from each of Examples 1–4.

EXAMPLE 6

The purpose of this Example is to demonstrate the preferred concentrations of the polycarbosilane promoters of the present invention for maintaining the adhesion characteristics of the instant polycarbosilane modified poly(arylene ether) wafer coatings prepared in the same general manner as outlined in Examples 1–4 above. Various Cyclohexanone solutions of dihydridopolycarbosilane and Allied Signal's FLARE™ and FLARE™ 2.0 are prepared, processed into films, and spun onto TEOS and SiN coated wafers in a manner as described in Examples 1–5 and subjected to solvent delamination and stud pull tests. FLARE™ is a poly(arylene ether) comprised of a homopolymer of (a) fluorene bisphenol and (b) 4-fluoro-3'-(4-fluorobenzoyl) tolane in a 1:1 monomer ratio (see Example 1) and FLARE™ 2.0 is a copolymer of (a) fluorene bisphenol, (b) bis (4-fluorophenyl) ethyne, and (c) 4,4' difluorobenzophenone copolymer (see Example 2) in a 2:1 monomer ratio. The results of these tests are outlined in Table 1.

In the solvent delamination test, the tendency of the present organic films to delaminate is enhanced by exposure of the films to a hot amine-based solvent, ACT 690, available commercially from Ashland Chemical Co. and generally employed as a cleaning solvent in semiconductor processing. The hot solvent enters the film either by diffusion through the film or entry through an interface. It is theorized that any delamination is caused by the solvent effectively "outcompeting" the organic film for bonding sites on the oxide or nitride surfaces. In this test, the organic film is spun onto the desired TEOS and SiN substrates and cured for 1 hour by conventional techniques well known in the art and illustrated in Example 4. The wafer is cleaved to generate an approximate 2" by 1" sample which is marked with a grid in one corner of the sample. The sample is exposed to ACT 690 for 30 minutes at 70° C. in a small vial with agitation, rinsed with deionized (DI) water, and allowed to air dry. Any film delamination observed in the solvent bath or rinse is noted and recorded as a failed sample.

A tape test is performed across the grid marking in the following manner: (1) a piece of adhesive tape, preferably Scotch brand #3m600-1/2X1296, is placed on the film and pressed down firmly to make good contact; and (2) the tape is then pulled off rapidly and evenly at an angle of 180° to the film surface. The sample is considered to pass if the film remains intact on the wafer, or to have failed if part or all of the film pulls up with the tape.

In a Stud Pull Test, epoxy-coated studs are attached to the surface of a wafer containing the films of the present invention. A ceramic backing plate is applied to the back side of the wafer to prevent substrate bending and undue stress concentration at the edges of the stud. The studs are then pulled in a direction normal to the wafer surface by a testing apparatus employing standard pull protocol steps. The stress applied at the point of failure and the interface location are then recorded. A pull value of 9 kilo-pounds per square inch (kpsi) (1 kpsi=1000 pounds per square inch) is considered satisfactory polymer/interface adhesion for semiconductor wafers.

TABLE 1

| % Polycarbosilane/ Poly(arylene ether) Concentration | Post ACT 690 Tape Test Results for FLARE ™ 2.0 polymer on oxide and nitride substrates | Post ACT 690 Tape Test Results for FLARE ™ polymer on oxide and nitride substrates | Post ACT Stud pull values |
|---|---|---|---|
| 0 | Failed | Failed | <1 kpsi |
| 0.4 | Failed | Failed | |
| 0.8 | Passed | Passed | >11 kpsi |
| 2.0 | Passed | Passed | |
| 4.0 | Passed | Passed | |

The qualitative data of Table 1 for both tests demonstrates that a polycarbosilane in a concentration of about 0.5% by weight of the poly(arylene ether) polymer is effective in promoting film adhesion to both TEOS (oxide) and SiN coated semiconductor substrates. Therefore, a polycarbosilane promoter concentration between about 0.5 wt %and 20wt % of the poly(arylene ether) base polymer is considered the effective range of polycarbosilane additive in the instant poly (arylene ether)/polycarbosilane-modified polymer compositions, with preferred concentrations being from about 0.5 to 5 wt. %. As indicated, these concentration ranges of polycarbosilane adhesion promoter in the polycarbosilane-modified poly(arylene ether) polymer are effective with both the TEOS and SiN coated substrates to maintain adhesion of the instant polymer films to the TEOS or SiN layers.

The polycarbosilane adhesion promoter/poly (arylene ether) compositions of the present invention provide unexpected adhesive properties as a film coating material and particularly a polymer composition useful as a replacement for silica based-dielectric material in electronic surfaces. The poly (arylene ethers) and the polycarbosilane adhesion promoters are also easily synthesized or readily accessible.

While foregoing is directed to the preferred embodiments of the present invention, other and further embodiments of the invention may be devised without departing from the basic scope thereof, and the scope thereof is determined by the claims that follow.

What is claimed is:

1. An adhesion promoter composition for low k dielectric polymers comprised of at least one polycarbosilane of the formula:

FORMULA (I)

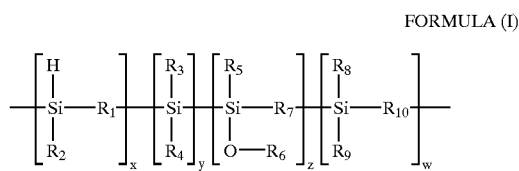

in which:

$R_1$, $R_7$, and $R_{10}$ each independently represents a substituted or unsubstituted alkylene, cycloalkylene, or arylene group;

$R_2$, $R_3$, $R_4$, $R_5$, $R_8$ and $R_9$ each independently represents a hydrogen atom or organic group, $R_6$ represents an organosilicon, a silanyl, a siloxyl, or an organo group; and x, y, z and w satisfying the conditions of $4 \leq x+y+z+w \leq 100{,}000$, and y and w can collectively or independently be zero.

2. The adhesion promoter composition of claim 1, wherein the polycarbosilane is selected from the group consisting of polydihydridocarbolisane, polyallyhyridocarbosilane, and random copolymers of polydihydridocarbolisane and polyallyhyridocarbosilane.

3. A film coating composition comprising:
   (a) the polycarbosilanes of claim 1; and
   (b) a low k dielectric polymer.

4. The film coating composition of claim 3 wherein the dielectric polymer is a poly(arylene ether) having the repeating units of the formula:

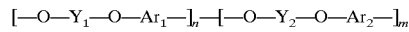

wherein n=0 to 1; and m=1−n; and wherein $Y_1$, $Y_2$, $Ar_1$ and $Ar_2$ are each are individually divalent arylene radicals.

5. A curable poly(arylene ether) polymer film composition exhibiting superior adhesion to substrate surfaces comprising:

a) a poly(arylene ether) having the repeating units of the formula:

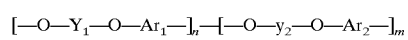

wherein n=0 to 1; and m=1−n; and wherein $Y_1$, $Y_2$, $Ar_1$ and $Ar_2$ are each are individually divalent arylene radicals; and b) small, effective, adhesion promoting amounts of a composition comprising at least one polycarbosilane of the formula:

FORMULA (I)

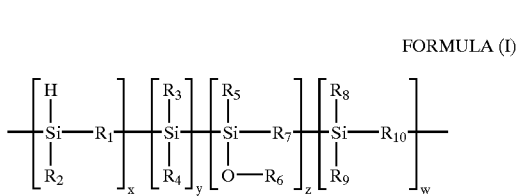

in which:
- R$_1$, R$_7$, and R$_{10}$ each independently represents a substituted or unsubstituted alkylene, cycloalkylene, or arylene group;
- R$_2$, R$_3$, R$_4$, R$_5$, R$_8$ and R$_9$ each independently represents a hydrogen atom or organic group,
- R$_6$ represents an organosilicon, a silanyl, a siloxyl, or an organo group; and
- x, y, z and w satisfying the conditions of $4 \leq x+y+z+w \leq 100,000$, and y and z and w can collectively or independently be zero.

6. The poly(arylene ether) composition of claim 5 in which the polycabosilane is present in amounts of from about 0.5 to 20% by weight of the poly(arylene ether) base polymer.

7. The composition of claim 5, in which the poly(arylene ether) comprises homopolymers, block or random copolymers, or polymer blends, comprising at least one of: (i) a copolymer of (a) fluorene bisphenol, (b) bis (4-fluoropheyl)ethyne and (c) 4,4'-difluoro-benzophenone; (ii) a homopolymer of (a) fluorene bisphenol and (b) 4-fluoro-3'-(fluorobenzoyl) tolane; (iii) a homopolymer (a) fluorene bisphenol and (b) bis(4-fluorophenyl) ethyne; or (iv) a homopolymer of (a) fluorene bisphenol and (b) 4,4' difluorobenzophenone.

8. The composition of claim 6 in which the polycabosilane is present in amounts of from about 0.5 to 5% by weight of the total poly(arylene ether)/adhesion promoting polycarbosilane polymer composition.

9. A multilayer electronic circuit article comprising: (i) silicon, glass or ceramic substrate, (ii) a plurality of layers or rehions of an insulating material on a surface of a the substrate, and (iii) at least on layer or region of a conductive material selected from the group consisting of metals and semiconductor materials, which are interposed between adjacent layers of the insulating material or withing a layer of the insulating material comprising the low k dielectric polycarbosilane-modified/poly(arylene ether) of claim 5.

10. The article of claim 9, in which the poly(arylene ether) comprises homopolymers, block or random copolymers, or polymer blends comprising at least one of: (i) a copolymer of (a) fluorene bisphenol, (b) bis (4-fluorophenyl)ethyene and (c) 4,4'-difluoro-benzophenone; (ii) a homopolymer of (a) fluorene bisphenol and (b) 4-fluoro-3'-(fluorobenzoyl) tolane; (iii) a homopolymer (a) fluorene bisphenol and (b) bis(4-fluorophenyl) ethyne; or (iv) a homopolymer of (a) fluorene bisphenol and (b) 4,4' difluorobenzophenone.

* * * * *

UNITED STATES PATENT AND TRADEMARK OFFICE
CERTIFICATE OF CORRECTION

PATENT NO. : 6,761,975 B1
DATED : July 13, 2004
INVENTOR(S) : Tian-An Chen et al.

It is certified that error appears in the above-identified patent and that said Letters Patent is hereby corrected as shown below:

Column 20,
Lines 32-33, replace "$4 \leqq x+y+z+w \leqq 100,000$," and insert therefor
-- $4 \leq x+y+z+w \leq 100,000$, --.

Column 21,
Lines 18-19, replace "$4 \leqq x+y+z+w \leqq 100,000$," and insert therefor
-- $4 \leq x+y+z+w \leq 100,000$, --.

Signed and Sealed this

Fifteenth Day of March, 2005

JON W. DUDAS
*Director of the United States Patent and Trademark Office*